United States Patent [19]
Leuthold et al.

[11] Patent Number: 5,592,732
[45] Date of Patent: Jan. 14, 1997

[54] METHOD OF MAKING SUPER CONDUCTING BONDS FOR THIN FILM DEVICES

[75] Inventors: Arthur C. Leuthold; Ronald T. Wakai, both of Madison, Wis.

[73] Assignee: Wisconsin Alumni Research Foundation, Madison, Wis.

[21] Appl. No.: 334,161

[22] Filed: Oct. 26, 1994

[51] Int. Cl.$^6$ .................................................. H01L 39/24
[52] U.S. Cl. ............................... 29/599; 29/842; 29/843; 174/94 R; 505/927
[58] Field of Search ........................... 29/599, 842, 843; 505/927; 174/94 R

[56] References Cited

U.S. PATENT DOCUMENTS

| | | | |
|---|---|---|---|
| 3,346,351 | 10/1967 | Flashman | 29/194 |
| 3,352,008 | 11/1967 | Fairbanks | 505/927 X |
| 3,905,839 | 9/1975 | Hashimoto | 29/599 X |
| 4,631,808 | 12/1986 | Jones | 505/925 X |
| 5,110,034 | 5/1992 | Simmonds | 228/179 |

FOREIGN PATENT DOCUMENTS 119549  7/1970  United Kingdom ..................... 29/599

OTHER PUBLICATIONS

Bi–In Equilibrium Phase Diagram.
In–Pb Equilibrium Phase Diagram.
In–Sn Equilibrium Phase Diagram.

*Primary Examiner*—Carl J. Arbes
*Attorney, Agent, or Firm*—Quarles & Brady

[57] ABSTRACT

An electrical connection between first and second members of superconductive material, such as niobium, is made by coating each member with an indium-lead-tin alloy solder. Each member is coated by initially applying a layer of either an indium-lead alloy or indium to a surface of the member. Then the surface is mechanically worked to break up any oxide coating that is underneath the applied layer. Next a lead-tin alloy or tin is alloyed with the applied layer to form a resultant surface layer of a indium-lead-tin alloy. The first and second members are placed in contact with each other and their respective surface layers of the indium-lead-tin alloy are melted to produce a bond therebetween. A bond form by this method also is described.

14 Claims, 1 Drawing Sheet

METHOD OF MAKING SUPER CONDUCTING BONDS FOR THIN FILM DEVICES

BACKGROUND OF THE INVENTION

The present invention relates to electrical connections for superconducting devices, and more particularly to methods for soldering superconductive materials and to the bond created thereby.

Niobium is a widely-used material for superconductor thin-film device fabrication due to its high transition temperature, ruggedness and ease of deposition. However, one drawback of niobium is the difficulty in forming superconducting connections because of a hard oxide layer that forms on its surface.

Methods of making superconducting electrical connections include mechanical pressure contacts, spot welding, ultrasonic wire bonding and soldering. Pressure contacts require relatively bulky apparatus and are not reliable. Spot welding can be used only with electrically conductive substrates and is not applicable to use with thin-film devices. Ultrasonic wire bonding requires relatively sophisticated techniques. Thus soldering is a desirable bonding method, provided that the solder is superconductive.

Conventional lead-tin solder is superconductive at low temperatures, but does not adhere well to niobium because of the oxide surface layer. Niobium oxidizes extremely fast making conventional techniques for cleaning oxidation from a surface prior to soldering unsuccessful because re-oxidization occurs before the surface can be coated with lead-tin solder. Soldering to niobium can be performed using lead-indium or lead-bismuth alloys as described in U.S. Pat. No. 3,346,351. These compounds adhere to the oxidized surface of niobium, but are soft and corrode easily. Adding tin to lead-indium alloy solder to improve corrosion resistance produces a solder which will not adhere to the oxidized surface of niobium and merely forms solder balls on that surface.

SUMMARY OF THE INVENTION

The general object of the present invention is to provide a superconductive solder joint which is durable and corrosion resistant.

Another object of the present invention is to provide a method for soldering to niobium and other refractory metals.

These objects are accomplished by a soldering technique which first applies a external layer of either indium or an indium-lead alloy to a conductor formed of a refractory metal, such as niobium or titanium. Mechanical action then is used to break up any oxide coating that is beneath the applied layer. For example, the tip of the soldering iron that was used to apply the initial layer can scratch the surface of the conductor while that layer is in a molten state. Because the layer of applied material is in a molten state, the exposed refractory metal is protected from the atmosphere and does not oxidize. After the oxide coating has been broken up, lead-tin solder then is melted onto the substrate surface if the initial layer is indium, or either pure tin or lead-tin solder is applied if an indium-lead alloy is used as the initial layer.

If a solder joint is to be made between two refractory metal objects, the appropriate portions of both objects are coated in the above-described manner. The objects then are held together while heat is applied to melt their respective coatings together and produce a bond therebetween.

In the above technique, the composition of the first layer has characteristics which allow it to adhere to the oxide coating on the refractory metal, thereby protecting the exposed metal during the oxide break up step. The subsequent step of adding tin does not result in the combined material balling up on the surface of the substrate since final indium-lead-tin alloy will adhere to the exposed refractory metal. The resultant solder compound includes indium for good initial adherence to the oxide on the refractory metal, lead which has superconducting characteristics, and tin for corrosion resistance.

DETAILED DESCRIPTION OF THE INVENTION

Figure 1:
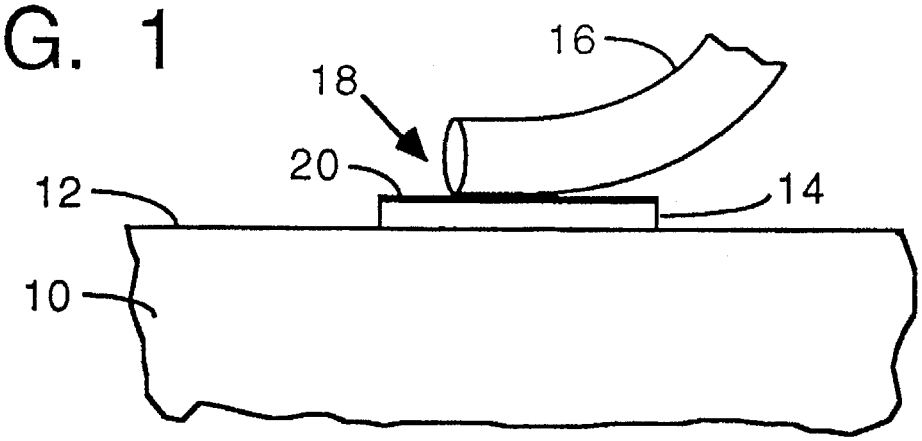
FIG. 1 is a plane view of a solder joint according to the present invention.

Although the present soldering method can be used to bond to different types of refractory metals, the process has particular application in forming a joint between two superconductors. Therefore, the present invention will be described in the context of a superconducting joint formed between two niobium conductors.

With reference to the drawing, there is shown a conventional silicon substrate 10 having typical superconducting circuitry mounted on surface 12. The circuitry includes a contact pad 14 formed by a thin film of niobium to enable external connection of a superconducting wire 16 which also may be of niobium. For example, the niobium contact pad 14 may have a thickness of 1,000 to 2,000 Angstroms and has been applied to the silicon substrate 10 by a conventional deposition technique. A solder joint 18 bonds the wire 16 to the thin film niobium contact pad 14. A special soldering process is employed in order to provide a strong, corrosion resistant bond between the two niobium conductors 14 and 16.

A first step of the soldering process applies a layer of a first material which is either indium or an indium-lead alloy. This is accomplished using a conventional soldering iron to heat the contact pad 14 to the melting point of the first material. For example, a 25 watt soldering iron with a fine, silver-plated, iron-clad copper tip may be used. Then a thin wire of the first material is touched against the surface of the contact pad 14 so that the first material melts and flows to cover the entire surface to which contact will be made. The tendency of the indium to "ball up" is overcome with continuous heating and movement of the soldering iron tip. Thus the appropriate surface of the contact pad 14 is covered with a layer of the first material.

Next, mechanical action is applied to the contact pad 14 to break up the oxide coating which had previously formed on the surface of the niobium and which now is underneath the layer of the first material. In the preferred embodiment, the tip of the soldering iron is used to scratch the upper surface of the contact pad, scraping away some of the oxide to expose the niobium beneath the oxide coating. Ordinarily, niobium oxidizes very rapidly. However, the layer of the first material still is in a molten state and flows over the exposed niobium to which it adheres. Therefore, the exposed niobium is protected from an oxidizing atmosphere and oxidation does not occur. These initial steps provide a very good bond between the first material and the niobium contact pad 14. Other forms of mechanical action, such as applying ultrasound to the surface of the contact pad 14, can be used to break up the oxide coating.

After the oxide coating has been broken up, a second material that includes tin is applied to the treated surface of the contact pad 14. If the first material was an indium-lead alloy, the second material may be pure tin. However, because of the relatively high melting temperature of tin, a 50/50 lead-tin alloy, such as commonly used for solder, may be employed as the second material whether the first material was pure indium or an indium-lead alloy. While the layer of the first material is in a molten state, a thin wire of the second material is touched against the contact pad 14 and allowed to melt. This results in the layer on the surface of the contact pad becoming a indium-lead-tin alloy. For example, the final composition of the solder alloy is approximately fifty percent indium and fifty percent 50/50 lead-tin alloy. Whereas, this alloy normally would not adhere to the surface of the contact pad 14 because of the oxide coating on the niobium, the solder layer 20 has good adherence because of the break-up of the oxide and exposure of pure niobium in the previous step. Thus, the resultant layer of indium-lead-tin on the contact pad 14 has good adherence to the niobium, is superconductive at low temperatures, and has relatively good corrosion resistance.

If the wire 16 is formed of silver or copper in cases where superconduction is not required, the cleaned wire can be placed directly against the coated niobium contact pad 14 allowing the solder layer 20 to bond the wire to the contact pad. Because silver and copper oxidize at relatively slow rates, the joint can be made before significant oxidation occurs that would impede good bonding.

In instances where the wire 16 is formed of niobium for its superconductivity, the end of the wire also is coated with the solder layer prior to joining to the contact pad 14. The same process as was used to apply the solder layer 20 to the contact pad 14 is employed to coat the end of the electrical wire 16 with the indium-lead-tin alloy solder. Then the two coated surfaces are abutted and heat from the soldering iron melts the surface layers which flow together making a strong bond between wire 16 and contact pad 14.

We claim:

1. A method for making a connection between first and second members, steps of which method comprise:

applying a layer of a first material to a surface of the first member, wherein the first material is selected from a group consisting of indium and an indium alloy;

mechanically working the surface of the first member to break up any oxide coating that is on the first member underneath the layer of the first material; and alloying a second material with the layer of the first material applied to the surface of the first member, wherein the second material is selected from a group consisting of tin and a tin alloy, to form an alloy of indium-tin that bonds the second member to the first member.

2. The method as recited in claim 1 wherein the first material is a indium-lead alloy.

3. The method as recited in claim 1 wherein the second material is a tin-lead alloy.

4. The method as recited in claim 1 further comprising:

applying a layer of a third material to a surface of the second member, wherein the third material is selected from a group consisting of indium and an indium alloy;

mechanically working the surface of the second member to break up any oxide coating that is on the second member underneath the layer of the third material; and alloying a fourth material with the layer of the third material, wherein the fourth material is selected from a group consisting of tin and a tin alloy, to form an alloy of indium-tin.

5. The method as recited in claim 4 wherein one of the first material and second material comprises an alloy that includes lead.

6. The method as recited in claim 4 wherein said first and second members are formed of a metal selected from a group consisting of niobium and titanium.

7. The method as recited in claim 1 wherein said first member is formed of a metal selected from a group consisting of niobium and titanium.

8. The method as recited in claim 1 wherein the first material is an indium alloy other than an alloy containing tin.

9. A method for making a superconducting connection between first and second members of superconductive material, steps of which method comprise:

applying a layer of a first material to a surface of the first member, wherein the first material is selected from a group consisting of indium and an indium alloy;

mechanically working the surface of the first member to break up any oxide coating that is on the first member underneath the layer of a first material; and alloying a lead-tin alloy with the layer of the first material applied to the surface of the first member, wherein the second member is bonded to an alloy of the first material and the lead-tin alloy.

10. The method as recited in claim 9 wherein the first material is a indium-lead alloy, thereby forming an alloy of indium-lead-tin that bonds the second member to the first member.

11. The method as recited in claim 9 further comprising:

applying a layer of a second material to a surface of the second member, wherein the second material is selected from a group consisting of an indium-lead alloy and indium;

mechanically working the surface of the second member to break up any oxide coating that is on the second member under the layer of a second material; and alloying a lead-tin alloy with the layer of the second material.

12. The method as recited in claim 11 wherein said first and second members are formed of niobium.

13. The method as recited in claim 9 wherein said first member is formed of niobium.

14. The method as recited in claim 9 wherein the first material is an indium alloy other than an alloy containing tin.

* * * * *

UNITED STATES PATENT AND TRADEMARK OFFICE
CERTIFICATE OF CORRECTION

Patent No.   : 5,592,732

Dated        : January 14, 1997

Inventor(s)  : Arthur C. Leuthold, *et al.*

It is certified that error appears in the above-identified patent and that said Letters Patent is hereby corrected as shown below:

In column 1, before line 5, insert the following paragraph:

--This invention was made with United States Government support awarded by NIH, Grant # IR03 RR 06198. The United States Government has certain rights in this invention.--.

Signed and Sealed this

Twenty-seventh Day of January, 1998

Attest:

BRUCE LEHMAN

Attesting Officer

Commissioner of Patents and Trademarks